United States Patent
McClanahan et al.

(10) Patent No.: US 10,732,218 B2
(45) Date of Patent: Aug. 4, 2020

(54) SEAL MONITOR FOR PROBE OR TEST CHAMBER

(71) Applicant: Texas Instruments Incorporated, Dallas, TX (US)

(72) Inventors: Adolphus E. McClanahan, Garland, TX (US); Alan J. Wegleitner, Prosper, TX (US); Daniel A. Fresquez, Allen, TX (US); Mark Damone Gillette, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 893 days.

(21) Appl. No.: 14/836,616

(22) Filed: Aug. 26, 2015

(65) Prior Publication Data
US 2017/0059442 A1 Mar. 2, 2017

(51) Int. Cl.
*G01R 31/28* (2006.01)
*G01M 3/32* (2006.01)
*G01R 35/00* (2006.01)

(52) U.S. Cl.
CPC ....... *G01R 31/2874* (2013.01); *G01M 3/3272* (2013.01); *G01R 31/2862* (2013.01); *G01R 35/00* (2013.01); *G01R 31/2877* (2013.01)

(58) Field of Classification Search
None
See application file for complete search history.

(56) References Cited

U.S. PATENT DOCUMENTS

| | | | | |
|---|---|---|---|---|
| 5,198,752 A | * | 3/1993 | Miyata | G01R 1/07314 165/80.4 |
| 5,379,632 A | * | 1/1995 | Dyer | G01M 3/3227 73/40 |
| 6,005,404 A | | 12/1999 | Cochran et al. | |
| 6,279,383 B1 | * | 8/2001 | Balke | G01M 3/2876 73/40 |
| 7,816,937 B2 | | 10/2010 | Kwak et al. | |
| 2010/0039117 A1 | * | 2/2010 | Jacobs | G01R 31/311 324/537 |
| 2014/0150533 A1 | * | 6/2014 | Ono | G01M 3/3272 73/46 |
| 2014/0250981 A1 | * | 9/2014 | Overby | F23R 3/28 73/40 |
| 2014/0354312 A1 | | 12/2014 | Li et al. | |
| 2015/0145540 A1 | * | 5/2015 | Komatsu | G01R 31/2874 324/750.03 |

* cited by examiner

*Primary Examiner* — Nasima Monsur
(74) *Attorney, Agent, or Firm* — Ronald O. Neerings; Charles A. Brill; Frank D. Cimino

(57) ABSTRACT

A method of checking a seal of a probe chamber or test chamber (thermal chamber) during a freezing temperature chamber condition. The thermal chamber provided includes a probe card or a contactor for electrically testing a semiconductor device under test (DUT), a gas inlet, a chiller which provides a freezing chamber temperature, and a pressure sensor for sensing a pressure in the thermal chamber (chamber pressure). Using the pressure sensor, the chamber pressure is sensed while flowing a dry gas through the gas inlet sufficient to render the chamber pressure a positive pressure. The positive pressure is compared to a reference pressure, and from the comparing it is determined whether the thermal chamber is properly sealed.

12 Claims, 5 Drawing Sheets

SEAL MONITOR FOR PROBE OR TEST CHAMBER

FIELD

Disclosed embodiments relate to probing of wafers including semiconductor die or testing of packaged devices in environments that are at a temperature below the freezing point of water.

BACKGROUND

A conventional wafer probe utilizes a probe card within a prober body (or probe chamber) that includes a spaced-apart array of slender metal needles arranged to contact bond pads of die separated by scribe lines on a wafer, with each die treated as a device under test (DUT). A conventional package tester uses a contactor within a package test housing (or package chamber) having a plurality of contact pins arranged to contact pins of a package DUT. In either case, a stimulating signal is provided to the DUT, and the voltages and/or currents at selected nodes on the DUT are routed to measurement electronics of automatic test equipment (ATE) apparatus that includes a computing device. Besides being performed at room temperature, probe and package test may be also performed at an elevated temperature (85° C.) and/or at a freezing temperature (e.g., −40° C.) for "stress testing" purposes to identify premature failure units.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments recognize in order to probe die on wafers or test packaged devices at temperatures at or below the freezing point of water (freezing temperatures, ≤0° C., e.g., −40° C.) the associated chamber should be within a dry environment essentially free of moisture to avoid ice formation therein from leakage of ambient humidity inside the thermal chamber. Ice formed can result in ice being on the die of the wafer being probed and on the probe card, or on pins of the packaged device being tested and on the contactor. The result of ice formation can be erroneous leakage-based parametric device failures. As used herein, the prober body (or probe chamber) or package test housing (or package chamber) are both referred to by the common term "thermal chamber".

Disclosed methods measure and validate positive pressure within the thermal chamber using a pressure sensor (e.g., manometer) for eliminating icing within the thermal chamber to solve the problem of cold probe and package test device leakage failures from prober or tester hardware. Ensuring the thermal chamber is properly sealed and pressurized above the ambient pressure helps keep ambient moisture from entering the thermal chamber and forming ice during low temperature prober or test operations. Disclosed embodiments also include related methods to identify chamber seal integrity problems, and for setting the minimum flow rate of a dry gas to reduce utilization cost while still avoiding ice formation in the thermal chamber. One embodiment comprises a pressure sensor permanently mechanically connected (mounted) to the thermal chamber (i.e., to a wall of the prober body or the package test housing) at the time of system manufacture. Another embodiment comprises a releasably coupled pressure sensor as part of an adapter fixture (AF) for temporary system insertion.

Embodied as an AF, sensor electronics providing a pressure indicator meter may also be included. The AF can include a press fit sealing structure for affixing the AF to the prober pan opening or sealing to the tester access point, such as comprising a polytetrafluoroethylene (PTFE, or TEFLON) O-ring cup assembly.

DETAILED DESCRIPTION

Figure 1:
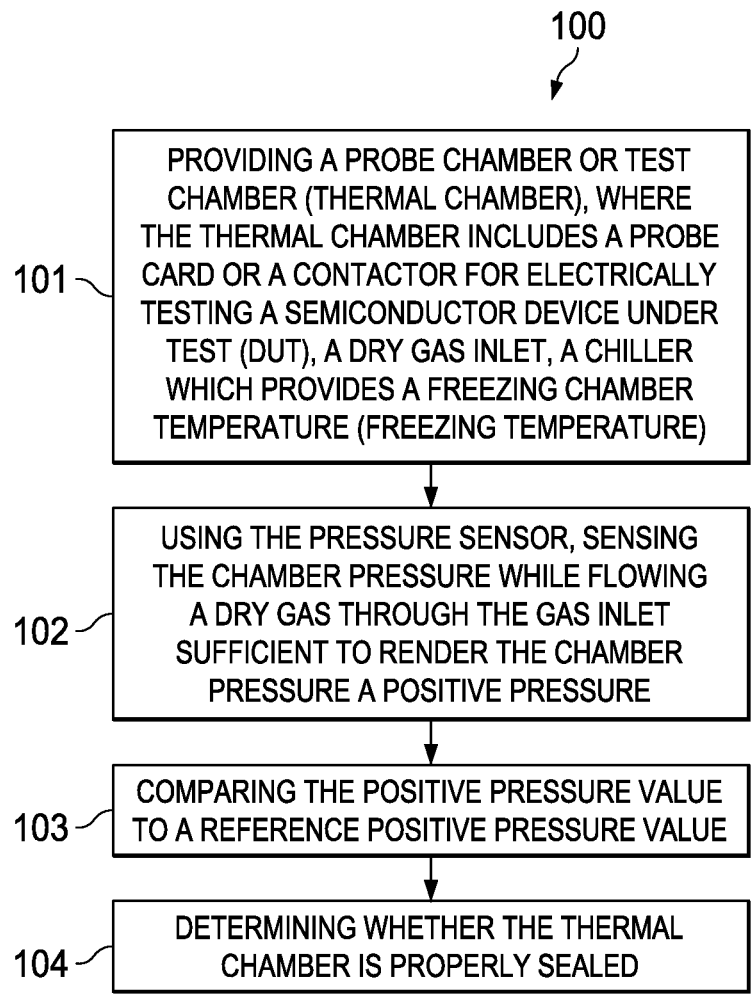
FIG. 1 is a flow chart showing steps in an example method of checking the seal of a thermal chamber during a freezing temperature chamber condition, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1 is a flow chart showing steps in an example method 100 of checking the seal of a probe chamber or test chamber (thermal chamber) during a freezing temperature chamber condition, according to an example embodiment. Step 101 comprises providing the thermal chamber, where the thermal chamber includes a probe card or a contactor for electrically testing a semiconductor device under test (DUT), a dry gas inlet, a chiller which provides a freezing chamber temperature (freezing temperature), and a pressure sensor for sensing a pressure in the thermal chamber (chamber pressure). The chiller can comprise a conventional refrigeration unit provided it can supply sufficient cooling to reduce the wafer chuck or contactor temperature below zero degrees Celsius. The pressure sensor can generally comprise any pressure measuring instrument, such as a sensing diaphragm, or a manometer which uses the difference in fluid height in a liquid column which is proportional to the pressure difference, where the pressure sensor measures in essentially real-time the chamber pressure. Commercially available pressure sensors can include built-in electronics (e.g., an amplifier and filter).

Step 102 comprises using the pressure sensor, sensing the chamber pressure while flowing a dry gas through the gas inlet sufficient to render the chamber pressure a positive pressure. Sensor electronics coupled to the output of the pressure sensor (see sensor electronics 245 in FIG. 2B described below) can be used to display the chamber pressure.

Step 103 comprises comparing the positive pressure value to a reference positive pressure value. The dry gas flow may be increased or decreased to obtain the reference pressure value. This allows the dry gas flow to be set for minimizing the dry gas cost. The dry gas can comprise compressed dry air (CDA) or $N_2$.

Step 104 comprises from the comparing (step 103) determining whether the thermal chamber is properly sealed. A properly sealed thermal chamber achieves a reference positive pressure with a given maximum flow of dry gas (that is a function of chamber pressure) into the chamber. One use of disclosed methods is to assist on probe system or test system conversion to freezing temperature operation by identifying sealing issues with the probe or test system that would otherwise cause chamber icing, allowing assembly panels for example to be repositioned to improve the chamber seal.

Figure 2A:
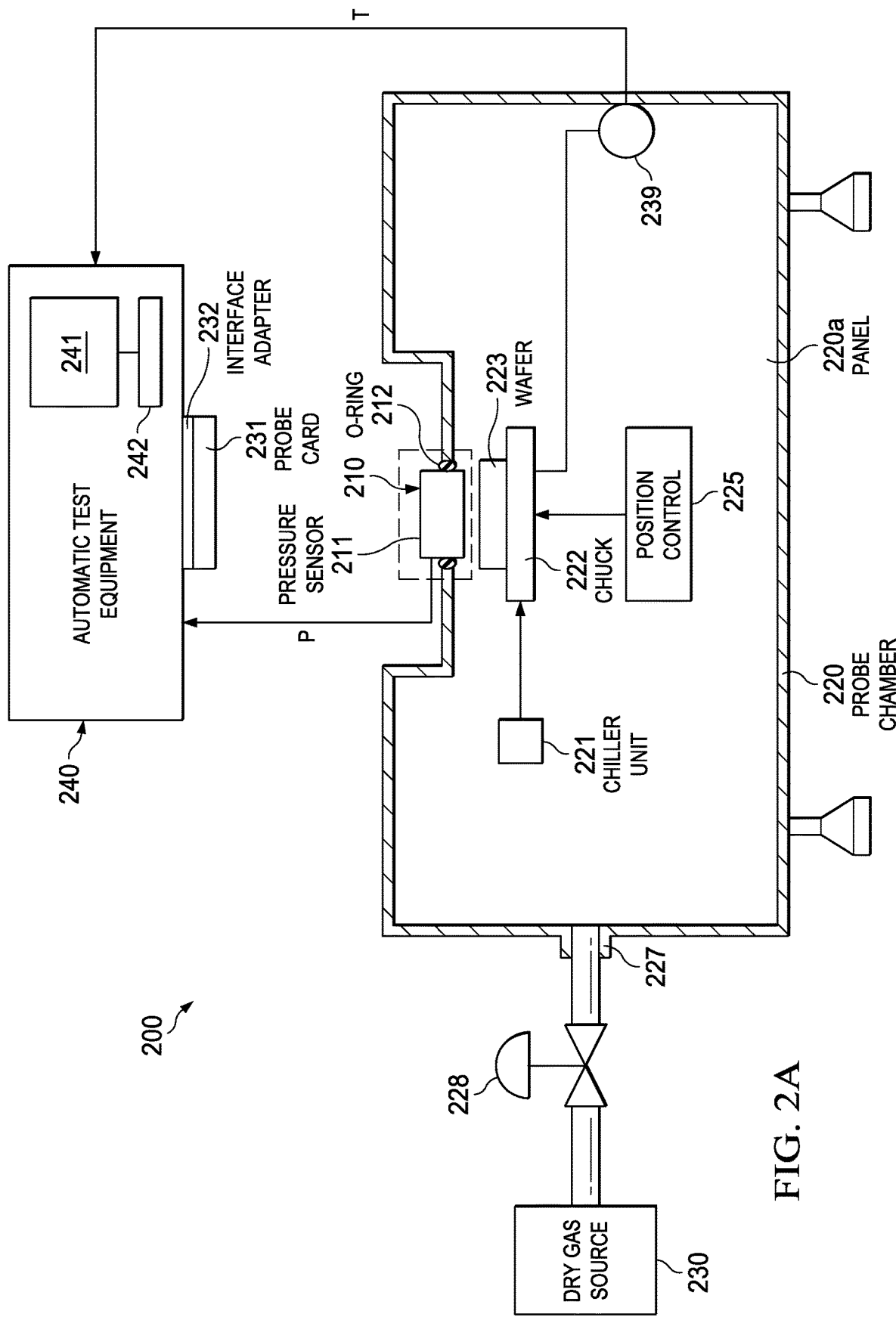
FIG. 2A is a depiction of a wafer probe system having a releasably coupled disclosed pressure sensor as part of an AF for system insertion into the probe system, according to an example embodiment.

FIG. 2A is a depiction of a wafer probe system 200 having a disclosed pressure sensor 211 as part of an AF 210 including an O-ring 212 for sealing to the prober pan opening of a refigured probe chamber (probe chamber) 220 for temporary insertion into the probe system, according to an example embodiment. Probe chamber 220 includes a plurality of assembly panels 220a. A refrigeration unit shown as a chiller unit 221 is coupled to a wafer chuck 222 for cooling the chuck shown having a wafer 223 thereon. A position control unit 225 is coupled to the chuck 222. The probe chamber 220 includes a gas inlet 227 for flowing a dry gas (e.g., $N_2$) therethrough supplied by a dry gas source 230 having a gas valve 228 in line.

A temperature sensor 239 is within the probe chamber 220 for sensing a temperature in the chamber (chamber temperature) shown measuring a temperature of the chuck 222. System 200 includes a probe card 231 coupled by an interface adapter 232 to automatic test equipment (ATE) 240 including a computing device (e.g., processor) 241 and associated memory 242 storing a chamber icing monitoring (CIM) algorithm for automatically probing the wafer 223. The ATE 240 is coupled to receive a signal indicating the chamber pressure (P) from the pressure sensor 211 and a signal indicating the chamber temperature (T), shown as the chuck temperature from the temperature sensor 239. The probe card 231 is shown in the up-position to allow the AF 210 to be affixed over the prober pan opening.

The AF 210 can be easily installed, with no tools, in place of the probe card 231 while chamber pressure measurements are being collected. The indicated P results can validate chamber seal integrity after prober maintenance or be utilized to modify a standard prober platform for cold probe applications. Dry gas flow setting can be executed by insuring the probe environment is at positive pressure differential relative to the external atmosphere. Upon meeting a predetermined criteria, the AF 210 can be replaced with the probe card 231 and probing function started after the chiller unit 221 achieves a desired probe temperature.

Figure 2B:
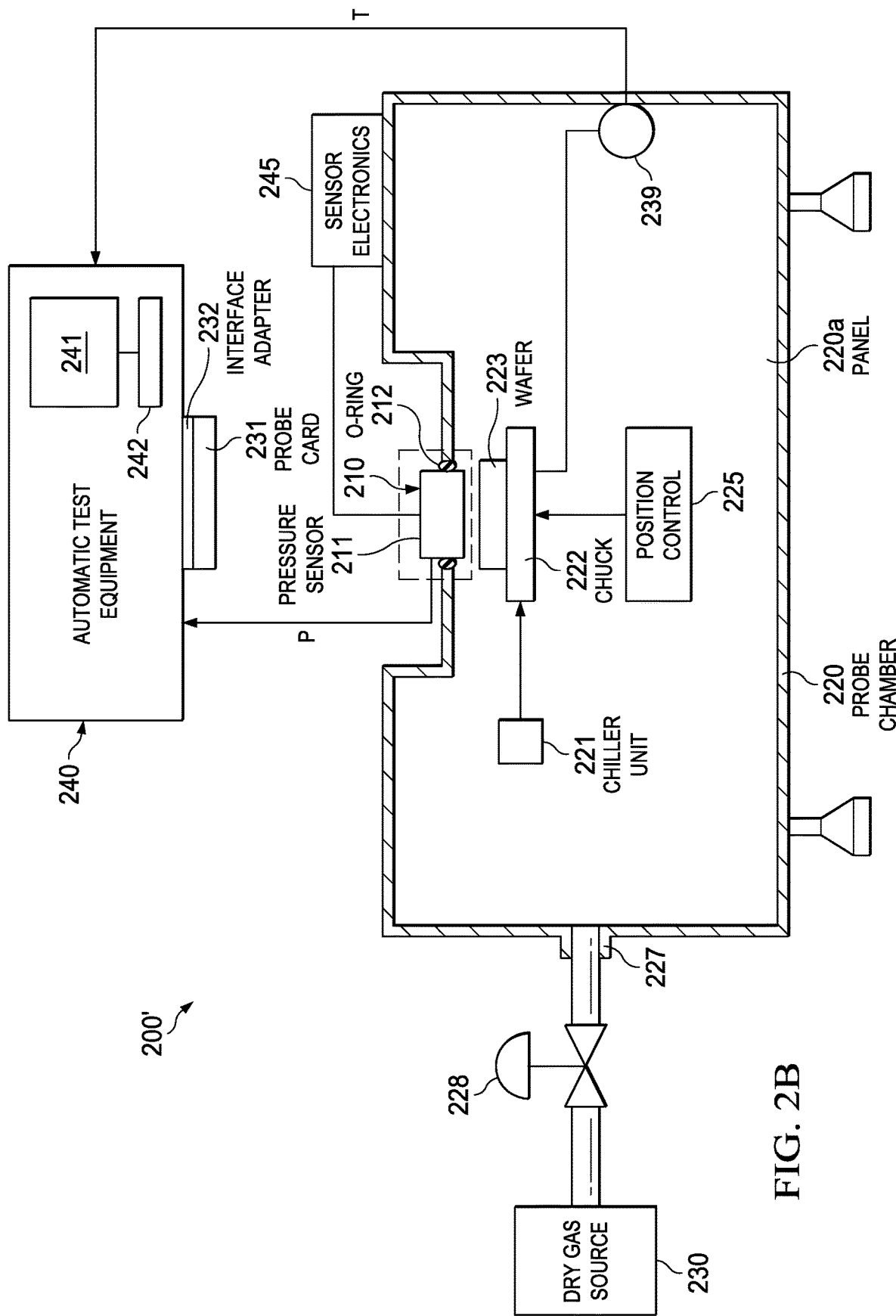
FIG. 2B is a depiction of the wafer probe system shown in FIG. 2A with added separate sensor electronics for displaying a chamber pressure value, according to an example embodiment.

FIG. 2B is a depiction of the system 200 shown in FIG. 2A with added separate sensor electronics 245 for displaying a chamber pressure value, with the system now shown as 200', according to an example embodiment. Sensor electronics 245 processes the sensing signal received from the pressure sensor 211, such as to convert it into a current level that represents the pressure value, and provides a chamber pressure readout.

Figure 2C:
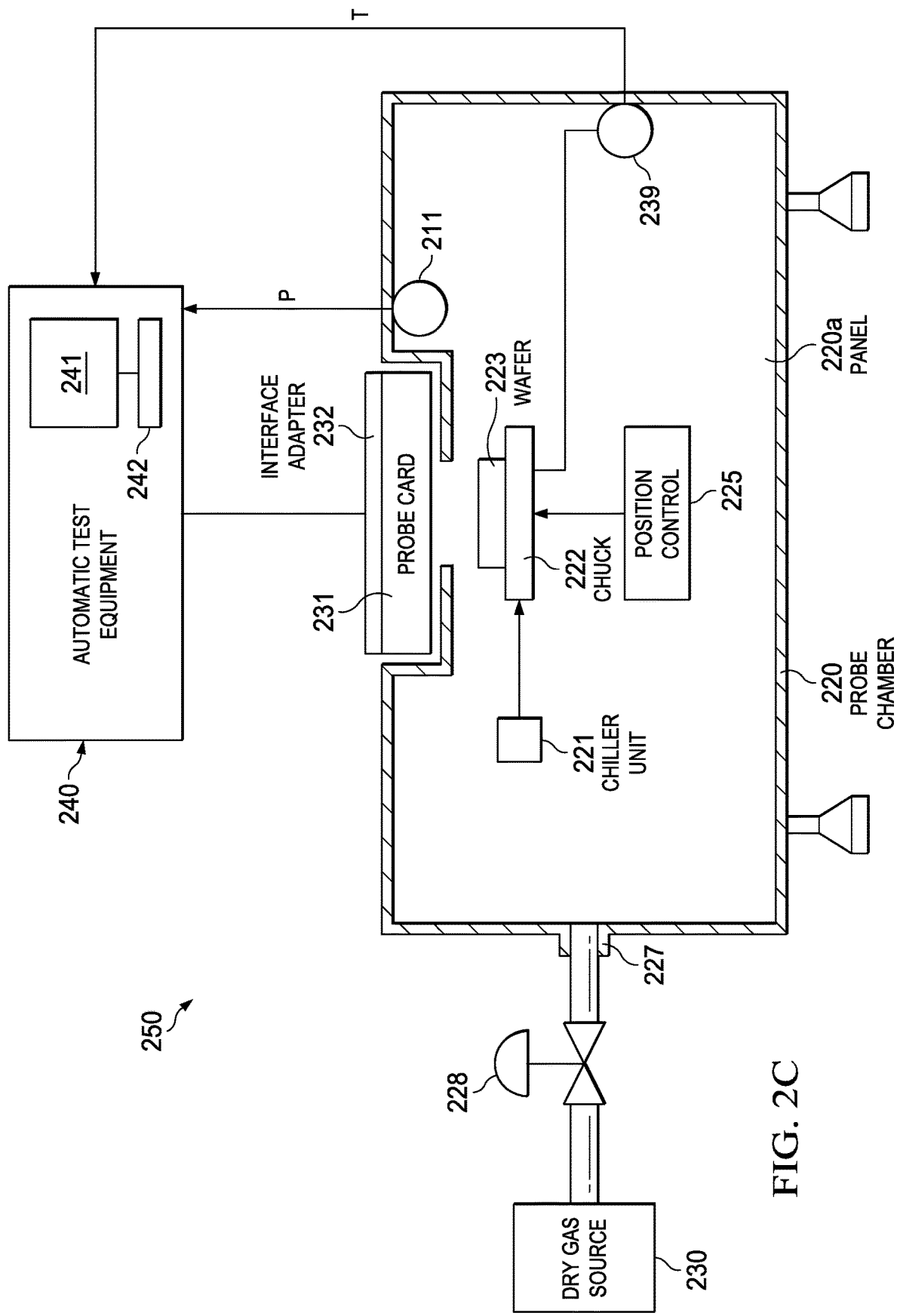
FIG. 2C is a depiction of a wafer probe system including a disclosed pressure sensor permanently affixed to the inside of a panel of the probe chamber, according to an example embodiment.

FIG. 2C is a depiction of a wafer probe system 250 including a disclosed pressure sensor 211 permanently affixed to one of the chamber panels 220a of the probe chamber 220, according to an example embodiment. In this embodiment the ATE 240 receives a signal indicating P from the pressure sensor 211 and a signal indicating T from the temperature sensor 239. The memory 242 in this embodiment can store a disclosed CIM algorithm which when implemented by computing device (e.g., processor) 241 initiates steps including provided P meets a predetermined positive pressure differential above an ambient pressure surrounding the probe chamber 220 and provided T satisfies a predetermined low temperature specification, automatically trigging probing the wafer 223 with the probe card 231. The ambient pressure can be assumed to be nominally 1 atmosphere.

However, when P does not meet the predetermined positive pressure differential (typically being below the predetermined positive pressure differential) or T does not satisfy the predetermined low temperature specification, the ATE 240 can automatically suspend probing of the wafer 223 (to allow taking the system offline for locating and solving/sealing the leak), or the dry gas flow may be increased in the case of P being below the predetermined positive pressure differential. The signal that indicates P from the pressure sensor 211 can thus be used to interlock the system 250 to assure proper positive pressure so that the combination of correct P and T will reduce set up time, increase up time, and reduce cost associated with extra usage of dry gas by validating proper chamber pressure before initiating a chill down cycle and device testing.

Figure 3:
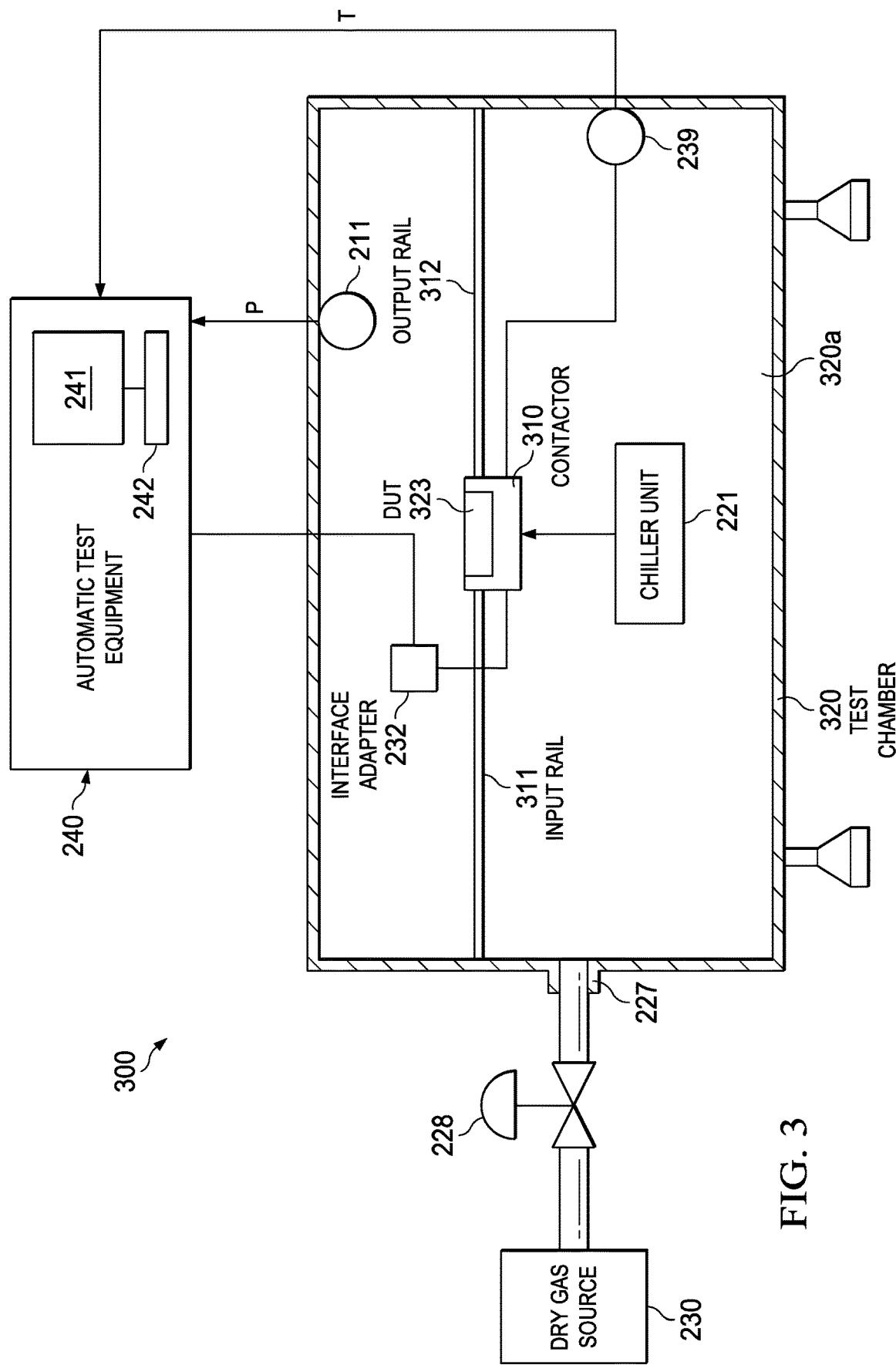
FIG. 3 is a depiction of a package test system including a disclosed pressure sensor permanently affixed to the inside of a panel inside of the test chamber, according to an example embodiment.

FIG. 3 is a depiction of a package test system 300 including a disclosed pressure sensor 211 permanently affixed to a panel 320a of the test chamber 320, according to an example embodiment. An input rail 311 delivers packaged devices shown as DUT 323 to the contactor 310 which is coupled to be cooled by chiller unit 221. After testing of the DUT 323, an output rail 312 delivers the DUT 323 out from the test chamber 320. The memory 242 in this embodiment can store a disclosed CIM algorithm which when implemented by computing device (e.g., processor) 241 initiates analogous steps described above for system 250 shown in FIG. 2C. As with system 250, the signal that indicates P from the pressure sensor 211 can be used to interlock the system 300 to assure proper positive pressure so that the combination of correct P and T will reduce set up time, increase up time, and reduce cost associated with extra usage of dry gas by validating proper chamber pressure before initiating a chill down cycle and packaged device testing.

Disclosed embodiments can be used to probe or test a variety of different IC devices and related products. The integrated circuit (IC) die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the IC die can be formed from a variety of processes including bipolar, CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A method, comprising:
flowing a dry gas into a thermal chamber sealed and maintained at a freezing temperature;
sensing a chamber pressure in the thermal chamber during the flowing the dry gas into the thermal chamber; and
increasing a flow rate of the dry gas into the thermal chamber when the chamber pressure is below a predetermined pressure differential in reference to an ambient pressure.

2. The method of claim 1, further comprising:
probing a semiconductor device in the thermal chamber only when the chamber pressure is at or above the predetermined pressure differential.

3. The method of claim 2, further comprising:
suspending the probing when the chamber pressure is below the predetermined pressure differential.

4. The method of claim 1, further comprising:
testing a semiconductor device in the thermal chamber only when the chamber pressure is at or above the predetermined pressure differential.

5. The method of claim 4, further comprising:
suspending the probing when the chamber pressure is below the predetermined pressure differential.

6. The method of claim 1, wherein the increasing the flow rate of the dry gas includes increasing the flow rate of the dry gas sufficient to prevent icing in the thermal chamber.

7. The method of claim 1, wherein the freezing temperature is at or below 0 degree Celsius.

8. The method of claim 1, wherein the sensing the chamber pressure includes using a manometer to sense the chamber pressure.

9. The method of claim 1, wherein the dry gas includes nitrogen.

10. The method of claim 1, wherein the thermal chamber includes a probe chamber.

11. The method of claim 1, wherein the thermal chamber includes a test chamber.

12. The method of claim 1, wherein the freezing temperature is at or below −40 degree Celsius.

* * * * *